United States Patent [19]

Kohno et al.

[11] Patent Number: 4,734,884
[45] Date of Patent: Mar. 29, 1988

[54] MAGNETIC BUBBLE MEMORY SYSTEM WITH FUNCTION OF PROTECTING SPECIFIC STORAGE AREA OF BUBBLE MEMORY FROM REWRITING

[75] Inventors: Tatsuhiko Kohno, Tokyo; Kazutoshi Yoshida, Mobara, both of Japan

[73] Assignee: Hitachi, Ltd., Tokyo, Japan

[21] Appl. No.: 734,606

[22] Filed: May 16, 1985

[30] Foreign Application Priority Data

May 16, 1984 [JP] Japan .................. 59-96467

[51] Int. Cl.⁴ ........................................... G11C 19/08
[52] U.S. Cl. ........................................ 365/1; 365/15
[58] Field of Search ...................... 365/1, 15

[56] References Cited

U.S. PATENT DOCUMENTS 4,159,412 6/1979 Naoen et al. .................. 365/15

FOREIGN PATENT DOCUMENTS 0063823 6/1978 Japan ........................ 365/1
0121428 10/1978 Japan ........................ 365/1
0117482 6/1985 Japan ........................ 365/1

Primary Examiner—James W. Moffitt
Attorney, Agent, or Firm—Antonelli, Terry & Wands

[57] ABSTRACT

A magnetic bubble memory system with a write protecting function is disclosed. In a power on reset mode or initializing mode of an information handling system including the bubble memory system, a bubble memory controller directs to and stores in its own memory, an information representative of a write protecting range for a bubble memory device, from a hidden memory region of the bubble memory device. The bubble memory controller compares the write protecting range to the information designating the address range of the bubble memory device in which a new information is to be written, in response to the write command from a host central processing unit. As a result of the comparison, if the both address ranges overlap each other, the bubble memory controller will execute the write protection and generate a write protection error message for the host CPU.

2 Claims, 10 Drawing Figures

MAGNETIC BUBBLE MEMORY SYSTEM WITH FUNCTION OF PROTECTING SPECIFIC STORAGE AREA OF BUBBLE MEMORY FROM REWRITING

BACKGROUND OF THE INVENTION

The present invention relates to a magnetic bubble memory system, and more particularly to a magnetic bubble memory system having a write protect function to prevent valuable memory contents from being erased or rewritten.

It has been known in a field of an audio magnetic tape cassette to protect valuable information recorded on a magnetic record medium from being erased.

A similar write protect function for a magnetic bubble memory cassette has been known by, for example, Japanese Utility Model Application Laid-Open No. 58-72795.

In those prior art devices, any writing into the storage medium is mechanically or electrically inhibited but a write protect function to a specific area on the storage medium is not provided.

SUMMARY OF THE INVENTION

It is an object of the present invention to provide a flexible bubble memory system which allows a hardware manufacturer or a software manufacturer of an information processing system utilizing the bubble memory to write-protect the bubble memory as required.

It is another object of the present invention to provide a flexible bubble memory system which allows an end user of the information processing system utilizing the bubble memory to write-protect the bubble memory as required.

It is another object of the present invention to provide a bubble memory system which allows write protection to a specific area of the magnetic bubble memory.

It is another object of the present invention to provide a bubble memory system which allows write protection to either an entire area or a specific area of the magnetic bubble memory.

It is a further object of the present invention to provide a bubble memory system which allows write protection to any number of memory areas.

In accordance with one embodiment of the present invention, information stored in a specific page (e.g. page 2048) of a magnetic bubble memory device (MBM) is written into a RAM in a bubble memory controller (BMC). When a host CPU issues a write instruction to the BMC, the BMC checks whether a write address to the MBM is within an address range stored in the RAM, and if it is not within the address range, the write instruction to the MBM is executed, and if it is within the address range, the writing is inhibited and a write protect error message is transferred to the CPU. Accordingly, when write protection to a specific memory area of the MBM is required, that memory area is stored in a specific page of the MBM. The protection range is able to be rewritten and non-volatilely stored. Since the storage medium to which write protection is to be effected and the storage medium in which the protect range is stored are of the same device, the relation between the storage media is always correct.

Further objects and features of the present invention will be apparent from the following description of the invention taken in conjunction with the accompanying drawings.

BRIEF DESCRIPTION OF THE ACCOMPANYING DRAWINGS

FIG. 1 illustrates a magnetic bubble memory system with write protect functions according to the present invention.

FIGS. 2A and 2B designate a hidden memory region of an MBM device having information representative of the write protect range of the MEM device.

DETAILED DESCRIPTION OF THE PREFERRED EMBODIMENTS

[1] Construction of the Whole System

Figure 1:
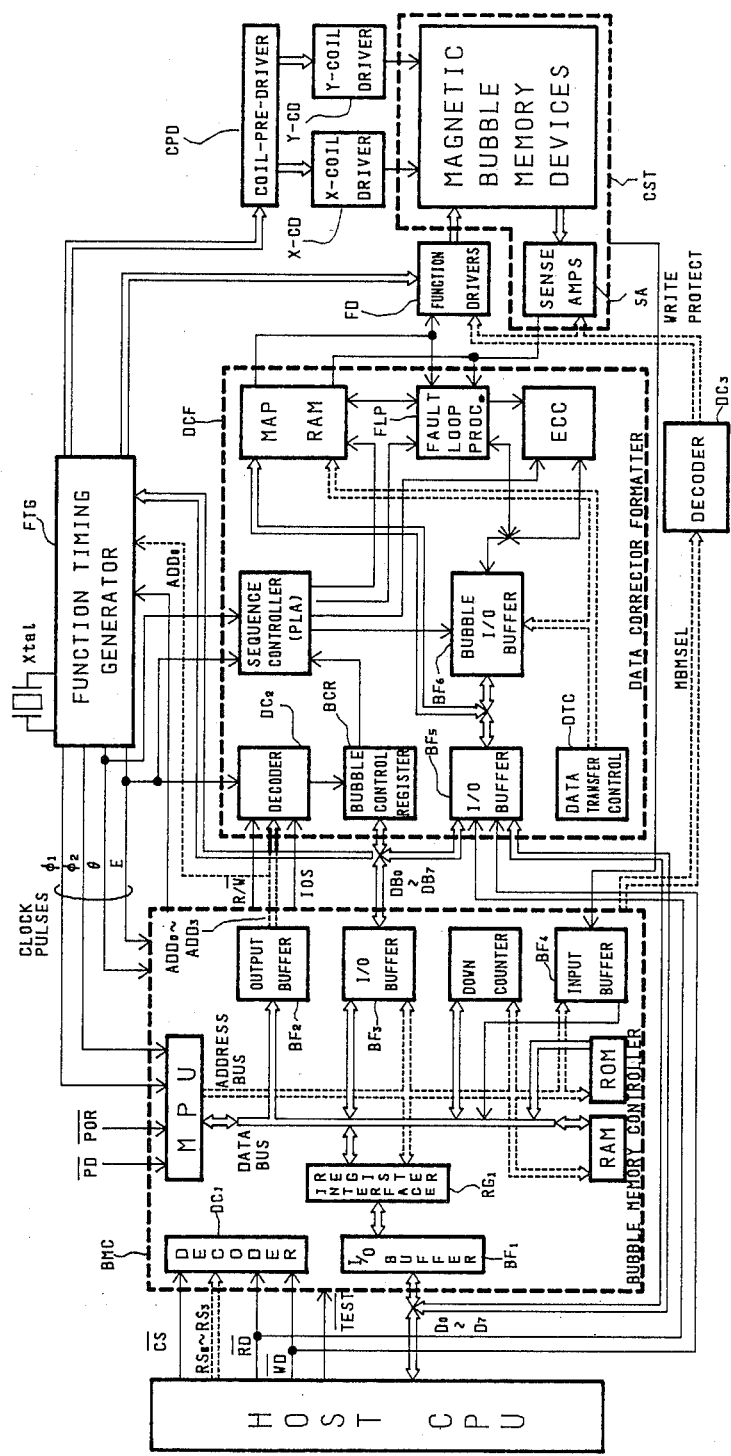

FIG. 1 illustrates a block diagram of a bubble memory system according to the present invention.

The coil drivers CD supply a triangular or rectangular wave for the rotating matnetic field for transfer of the magnetic bubble. The coil predriver CPD drives the coil drivers. The function drive FD supplies the pulse current to the bubble generator, replicator and swap gate of a function block in the bubble memory.

The sense amplifier SA amplifies the output signal of several mV from the bubble memory, discriminates between 1 and 0, and converts it to the TTL (Transistor Transistor Logic) level signal.

Function timing generator FTG generates the basic clock for the bubble memory unit, that is, the controller clock. It also generates various timing signals, such as the timing signal for the CDs supplying the necessary rotating magnetic field for bubble memory operation, timing signal to drive the FD and the SA strobe signal for output detection.

The control circuit as the center of the bubble memory control consists of the BMC and DCF.

The CD, CPD, FD, SA, FTG, BMC and DCF blocks are respectively constituted in integrated circuit (IC) form.

[2] Construction & Operation of BMC

The BMC functions as the interface with the host CPU. It translates the instructions from the host CPU and controls the bubble memory operation sequence. When the bubble memory system is configured, the host CPU sets the necessary commands for the bubble memory operation in the interface register in the BMC.

The bubble memory status can be determined by reading the interface register contents.

The DCF is the data control chip having the bubble memory data buffer and the RAM to store the defective loop data. It has the bubble memory defective loop processing function and the error correcting function. The data controller perfectly independent from the BMC and 2-page data buffer carries out direct data transfer with the host CPU. In some controllers, the BMC handles data transfer with the host CPU. In that case, serial transfer occurs between the BMC and DCF, so the number of blocks for parallel operation is restricted by the data transfer speed. The interface between the DCF and the host CPU is 8-bit parallel.

Independence of the DCF from the BMC enhances the adaptability of the system in the future. The bubble memory capacity will increase in the future. The number of minor loops of the bubble memory will increase. It means an increase of the RAM capacity for the data buffer and storage of the defective loops. The capacity of the existing DCF is insufficient. If the DCF is independent, an increase of the bubble memory in the future can be handled by an increase of the RAM capacity for the data buffer and storage of the defective loops.

Access from the CPU to the bubble memory starts from command writing in the command registers of the BMC. The command register is selected by the register select signal. The BMC decodes the command and controls other circuits of bubble memory system.

In writing data into the bubble memory, the BMC requests the host CPU that the data be written.

Upon receipt of this request, the CPU transfers the data to the data buffer in the DCF. The data buffer for this purpose is also selected by the register select signal via the BMC.

The data transferred from the host CPU is in the 8-bit parallel format. The DCF converts it into serial data and transfers the converted data to the bubble memory device. The BMC outputs the bubble memory operation control signal to the FTG. Upon receipt of this signal, the FTG generates the coil driver drive timing and FD timing signals.

These timing signals operate CDs to generate the rotating magnetic field for transfer of the magnetic bubble. The FD applies the pulse current to the bubble generator and swap gate to cause data writing into the bubble memory.

In reading the data from the bubble memory, the BMC generates and supplies the control signal to the FTG. According to this control signal, the FTG generates the coil driver drive timing, and CDs generate the rotating magnetic field. The replicator current is applied according to the timing signal to the FD. As a result, the data on the specified page in the bubble memory device is transferred to the detector. The detector output is discriminated by the SA between 1 and 0. The SA output is transferred to the data buffer in the DCF. When the data is transferred to the data buffer, the BMC informs the host CPU that the read data is ready. Upon receipt of this signal, the host CPU reads the data from the data buffer in the DCF. The serial data from the bubble memory is converted to the 8-bit parallel data in the DCF. Defective loop processing and data error correction are carried out in the DCF.

The MPU (microprocessing unit), 4K-byte ROM and 128-byte RAM are the control parts for the control.

The ROM stores the bubble memory control program. The RAM is used for bubble memory operation status flags, etc. during bubble memory control. The down-counter is operated by the clock synchronized with the rotating magnetic field. It counts the number of transferred bubble memory bits to set the bubble memory operation timing.

The interface register functions as the interface with the host CPU.

Ports 3 and 4 are for data transfer with the DCF and FTG. Port 3 handles the data DB 0–7, and port 4 the address signal ADD 0–3.

Table 1 shows thirteen types of BMC interface registers provided for communication with the host CPU.

TABLE 1

| Address (hexadecimal) | Abbreviation | Name |
|---|---|---|
| 1 | CMR | Command Register |
| 2 | STR | Status Register |
| 3 | ESR 1 | Error Status Register (1) |
| 4 | PAR | Page Address H |
| 5 |  | Register L |
| 6 | PCR | Page Count H |
| 7 |  | Register L |
| 8 | DNR | Device Number Register |
| B | ESR 2 | Error Status Register (2) |
| C | STBY | Standby Register |
| D | DTR | Device Type Register |
| E | DOR | DCF Operation Register |
| F | IVR | Interrupt Vector Address Register |

| Access | Function |
|---|---|
| R/W | Stores the commands for BMC operation. |
| R | Indicates the BMC operation status. |
| R | Indicates the status of errors occurring at the time of operation. |
| R/W | Stores the starting page of the accessed bubble memory. |
| R/W | Stores the number of accessed bubble memory pages. |
| R | Indicates the number of expanded serial and parallel devices. |
| R | Indicates the status of errors occurring during operations. |
| R/W | Register to set and reset the low power dissipation mode. |
| R/W | Indicates the type of the bubble memory device used. |
| R/W | Stores the number of the DCF to be used. |
| R/W | Register to generates the vector address upon interrupt occurrence. |

In addition, the data buffer allowing access from the host CPU is also provided in the DCF. The register select signal is input only to the BMC, but the BMC decodes this signal into the data buffer select SELBDR signal and outputs it to the DCF. Since these interface registers are accessed from the MPU and host CPU, they are connected to the external data bus with the host CPU and the internal data bus connected to the MPU in the BMC.

The bubble memory operation is controlled by the MBC control program. In the initialization after power on, internal registers of the BMC and DCF are set to the initial state. This operation is automatically carried out by changing the power on reset signal from "L" to "H". Main items subject to initialization are the host CPU type recognition, detection of the numbers of serial and parallel memory devices, data write inhibit page information fetch, etc.

The information about the data write protecting area is also fetched upon power on. Programs and user data are written into the bubble memory. With regard to the program area, rewriting by the user may cause troubles and the BMC has the write-protect function to prevent such troubles. The write protecting area information is written on a special page in the bubble memory. When the power is turned on, the BMC reads the write protecting area information from the special page and stores it to the RAM in the BMC. Any write specification for the corresponding area results in an error and no writing occurs. To cancel the write protection, set the write protection bit in the interface register to 1.

In the command waiting mode, the BMC judges whether a command is input or not. It also judges whether the host CPU sets the standby mode in the standby register among interface registers. In the command waiting mode, the power is supplied to all peripheral circuits of the bubble memory and the BMC starts command acceptance processing as soon as a command is input. In the standby mode, on the other hand, the power to all peripheral circuits other than the controller (BMC, DCF, FTG) can be turned off to reduce the bubble memory system power dissipation to almost zero. When the standby mode is set, the BMC outputs the drive circuit FD, CD operation stop signal and the STBY signal. The STBY signal causes the power to peripheral circuits other than the controller to be turned off. When the standby register is reset, the BMC resets the STBY signal and the power supply restarts. Upon lapse of a fixed time 5 msec after STBY signal resetting, the BMC should be set to the command waiting mode to be ready to receive a command from the host CPU.

The BMC translates the input command (see Table 2, later explained in section [4]) and executes the corresponding processing.

[3] I/O Signals of the BMC o $\theta$

This is to input a $\theta$ clock signal synchronized with the duration of the rotating field of the bubble memory. (during STANDBY, this is kept at low level in BMC.)

o E

BMC is input to the E clock which is a clock signal for data transfer between the BMC II, and the Data Collector Formatter DCF, and Function Timing Generator FTG. (During STANDBY, this is kept at low level in BMC.) The E clock has a frequency eight times that of the $\theta$ clock.

o $\phi_1$, $\phi_2$

This is to input $\phi_1$ clock and $\phi_2$ clock which are 2-phase clock signals for BMC internal operation. The frequency of $\phi_1$ and $\phi_2$ is twice that of E clock. The $\phi_1$ and $\phi_2$ are each a non-overlap signal.

o Data bus $D_0$–$D_7$

This is an 8-bit data bus for transferring data to the host CPU. This acts as an output terminal when writing data from the host CPU, and as an output terminal when reading the register in the BMC. The bubble data buffer BDR, BF6 of the bubble memory is in the other device DCF. When the host CPU reads the BDR, the terminal $D_0$–$D_7$ in the BMC enter the high-impedance state and the data on $D_0$–$D_7$ are outputted via the DCF.

o Register selection $RS_0$ to $RS_3$

This is to input signals for selecting the internal register of the BMC including BDR (Data Buffer) in the DCF, which has four terminals. Usually, lower 4-bits ($A_0$–$A_3$) of the host CPU address bus are connected to this terminal.

o Chip select ($\overline{CS}$)

This is to input a signal indicating that the host CPU has selected the BMC. Usually, this fully decodes and inputs high-order bits (excluding the lower 4-bits) of address bus. Each signal of $RS_0$–$RS_3$, $\overline{RD}$, $\overline{WR}$ is invalid for the BMC unless $\overline{CS}$ goes to the low level, except for the direct memory access (DMA) mode or interrupt request mode determined by the host CPU.

o Read $\overline{RD}$—Terminal to input clock signals for the host CPU to read the register in BMC. When this terminal is kept at low, the data of the register in BMC will be outputted to $D_0$–$D_7$.

o Write $\overline{RW}$—Terminal to input clock signals for writing in the register in BMC from the host CPU. When this terminal goes to low, the data of $D_0$–$D_7$ will be written in the register.

o BUS DIRECTION (BUS DIR, but not shown in the figure)

Terminal signals output for controlling the bus buffer output direction for connecting the host CPU to data bus $D_0$–$D_7$ by the bus buffer.

When the BUS DIR is set to low, data will be transferred from the CPU to BMC, and when the BUS DIR is set to high, data will be transferred from BMC to CPU (read from the host CPU).

o Data bus with DCF and FTG ($DB_0$ to $DB_7$)

This is a bidirectional data bus for use in the bubble memory system. This transfers data between BMC and DCF, and transfers data from BMC to FTG. This is as an output terminal when writing in the registers in DCF and FTG from BMC, and an input terminal when reading the register in DCF. To read parallel STR (Status Register) in DCF, $DB_3$, $DB_6$ and $DB_7$ perform precharge during period $\overline{E}$ and pull up during period E. Thus, the output of DCF is readable by wired or.

o DCF READ/WRITE (DCF R/$\overline{W}$)

Terminal to output signals indicating to read or write the register in DCF. This is a level signal, indicating READ when it is high and WRITE when it is low. This signal is valid only when $\overline{IOS}$ is low and READ/WRITE are performed while the clock signal E is high.

o I/O STROBE ($\overline{IOS}$)

Terminal to output signals indicating that the register in DCF is selected. When this terminal is set low, the register in DCF is selected.

o FTG WRITE STROBE (FTG WSTRB)

Terminal to output timing signals to the register in FTG to write the data from BMC. When this terminal is set to "High", the data of the $DB_0$–$DB_2$ will be written in the register DCF.

o ADDRESS OF DCF AND FTG ($ADD_0$–$ADD_3$)

Terminal to output signals to select registers in DCF and FTG. In DCF, $ADD_0$ to $ADD_3$ are used, while in FTG, only $ADD_0$ is used.

o BUBBLE MEMORY SELECT (MBM SEL)

Terminal to output signals for selection of unit for serial expansion of bubble memory devices.

o DRIVER DISABLE (DR DISABLE)

Terminal to output signals prohibiting the operation of coil driver (CD) and function driver (FD) to protect the data in bubble memory devices when the power supply is cut or restored (including turn to and return from the STANDBY mode).

When the power supply is cut or restored, this signal will become low.

o Power down ($\overline{PD}$)

Terminal to input power down warning signals. When this terminal becomes to low, BMC will immediately stop the rotating magnetic field and go low (DR DISABLE) to protect the data in the bubble memory devices. Since this takes 70 $\mu$s, at least 70 $\mu$s is required after setting $\overline{PD}$ to low to cutting the power. That $\overline{PD}$ has been input will be displayed on STR.

o WRITE PROTECT (WR PROTECT)

This input to the terminal specifies the device to perform write protect. Even if the WRITE BUBBLE command, WRITE BUBBLE (2) is input and this signal is set to high, data is not written in the bubble memory device.

[4] Bubble Control Command

The BMC controls the bubble memory according to the commands from the host CPU. Table 2 shows twelve types of commands provided for the BMC. Command execution starts when the command code is written in the CMR (command register). Commands are categorized into those for the CPU to use the bubble memory and those which are used only on special occasions such as the bubble test or defective loop data read/write operation.

The READ BUBBLE is the command to read the data from the bubble memory. When this command is input, the data on the page specified by the PAR (page address register) is read.

The WRITE BUBBLE command causes the data from the host CPU to be written into the bubble memory, the data is written on the page specified by the PAR. The code for error correction is also written.

TABLE 2

| Command code (hexa-decimal) | Command name | Function |
|---|---|---|
| 1 | READ BUBBLE | Reads the data from the bubble memory device while skipping defective loops |
| 2 | WRITE BUBBLE | Writes the data into the bubble memory device while skipping defective loops |
| 4 | INITIA-LIZE BUBBLE | Terminates all bubble memory devices, and loading the defective loop data of the first device in the serial direction |
| 5*1 | READ FREE | Reads the data from the bubble memory device without defective loop handling |
| 6*1 | WRITE FREE | Writes the data into the bubble memory device without defective loop handling |
| 7 | TERMI-NATE BUBBLE | Transfers the bubble to the position minimizing the map loop data read operation time |
| 9*1 | READ MAP LOOP | Reads the defective loop data from the map loop |
| A*1 | WRITE MAP LOOP | Writes the defective loop data into the map loop |
| B | READ BUBBLE (2) | Reads the data from the special page*2 of the bubble memory |
| C*1 | ERASE | Generates the timing to conduct a current to the bias coil to clear the bubble memory data |
| D | WRITE BUBBLE (2) | Writes the data into the special page*2 of the bubble memory |
| E | RESET | Resets and initializes BMC and DCF registers |

*1: These commands are used for testing with the $\overline{TEST}$ pin set to the L level.
*2: The bubble memory has $2^n + 1$ pages (2049 pages in the 4M-bit chip). Access by the READ BUBBLE or WRITE BUBBLE command is possible to page 0 to $2^n - 1$, and page $2^n$ cannot the accessed. This page $2^n$ is called the special page.

[5] Construction & Operation of DCF

The DCF is the LSI to control the bubble memory data system. It includes the interface, data buffer BF6, defect handling block (fault loop processing) and error correcting circuit ECC. The data buffer BF6 consists of a pair of 584-bit RAMS (RAM A and RAM B, not shown) whose total capacity corresponds to two bubble memory pages. The effective transfer data to and from the host CPU is usually 512 bits. All 584 bits are accessed only in the bubble memory test operation. Parallel-serial conversion of the 8-bit data occurs when it is transferred between the RAM and bubble memory. Therefore, the RAM configuration becomes different depending on whether it is accessed from the host CPU or from the bubble memory: 8-bit (73×8 bits) configuration for access from the host CPU and serial (584×1 bit) configuration for access from the bubble memory.

Figure 9:
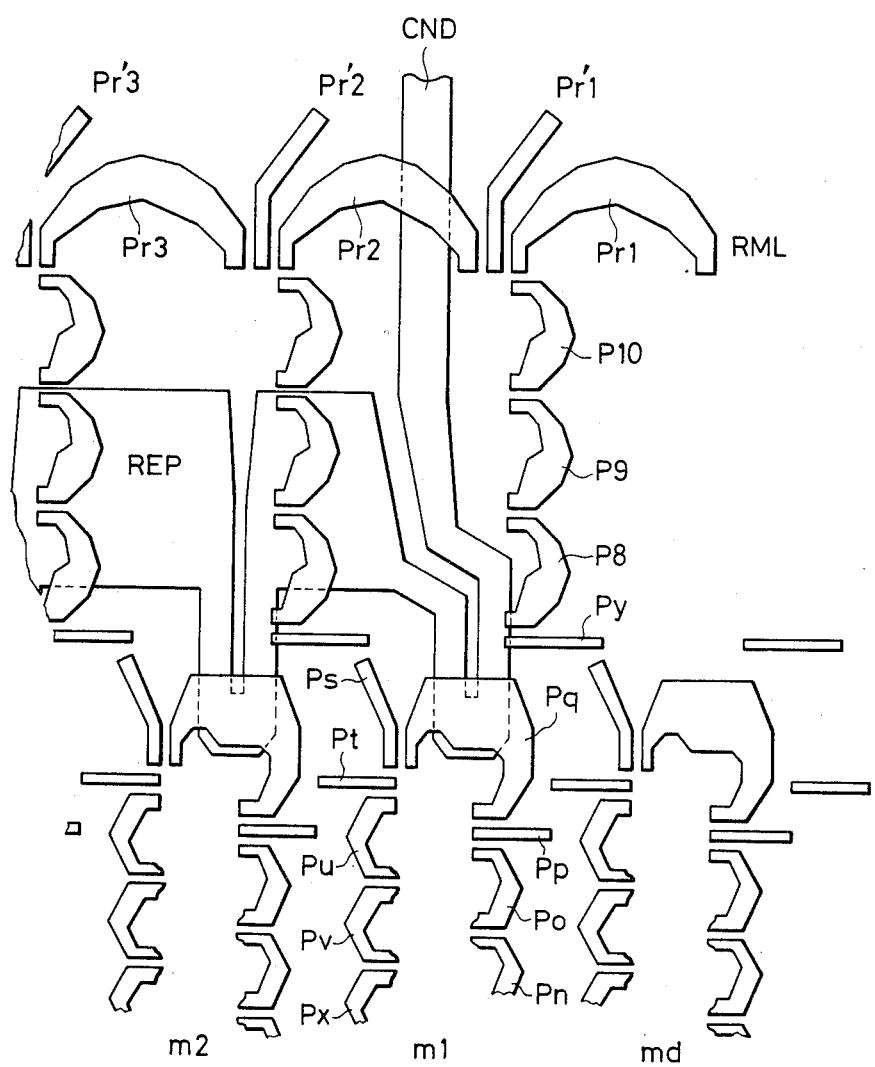

The host CPU accesses the data buffer in the address sequence according to the $\overline{WR}$ or $\overline{RD}$ signal only. The RAM counter counts the $\overline{WR}$ or $\overline{RD}$ signal and outputs the RAM address. The BMC resets the RAM counter immediately before the start of bubble memory operation by command input. As shown in FIG. 9, the host CPU does not have to recognize whether it is accessing RAM A or RAM B. The BMC sets the buffer state so that the access starts from RAM A before the start of bubble memory control after command input. After the start of data transfer, RAM A and RAM B are alternated upon transfer of one-page data.

It has been designed that one RAM can transfer data to or from the CPU while the other is transferring data to or from the bubble memory in order to increase the data transfer rate between the buffer and host CPU.

The bubble memory chip yield has been improved by allowing existence of defective minor loops. Data writing to the bubble memory and data reading from the bubble memory, therefore, shall be carried out with proper handling to avoid the influence of defective loops (defective loop handling).

The information about defective loops in the bubble memory is stored within the bubble memory device. This defective loop information is read from the bubble memory and stored in the map RAM in the DCF before the start of bubble memory operation. The information is always read before data transfer between the bubble memory and DCF so as to carry out defective loop handling. Because only one DCF is used for multiple bubble memory devices arranged in the serial direction, the defective loop data of the corresponding block is transferred to the map RAM each time a new block is accessed. In data write operation to the bubble memory, 0 is inserted to the data from the host CPU for each defective loop. In other words, no bubble is generated for defective loops. In data read operation from the bubble memory, defective loops are skipped.

The map loop method is adopted for storage of the information about defective loops in the bubble memory.

A special loop called the map loop is provided to address data and defective loop data. The map loop method has the following merit. The error correction can easily be applied to the defective loop data. In the map loop method, the defective loop data and correction code can be written in the same loop (map loop).

[6] Construction of FTG

The FTG is a CMOS LSI (complementary metal-oxide-semiconductor large scale integrated circuit) which has the function to generate the clock signals to the BMC and DCF and the function to generate the timing signals required for the bubble memory operation according to the control signals from the BMC. (See FIG. 3.)

It contains the oscillating circuit, so it is necessary to connect only a crystal oscillator to the FTG terminal.

The bubble memory operation frequency can be changed by the oscillation frequency of the crystal oscillator. The oscillation frequency is determined according to the resolution required by the function timing signals to drive the bubble memory.

[7] Organization of the Magnetic Bubble Memory Chip

Figure 7:
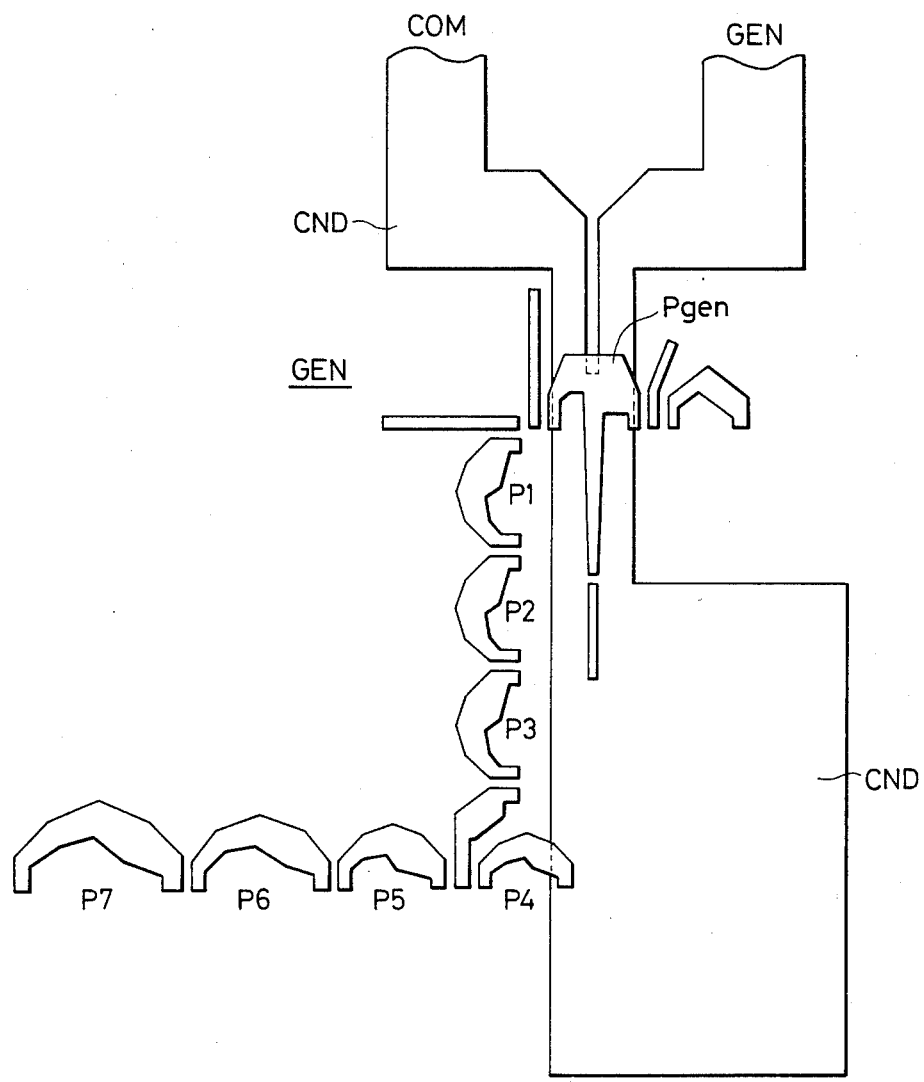

FIG. 7 schematically illustrates a magnetic bubbles memory (MBM) chip CHI with a pair of 1M bit blocks. In a 4M bit MBM device package, for example two chips are contained.

In FIG. 7 are shown minor loops $\underline{m}$ for storing information, a read major line RML for transferring the read out information and a write major line WML for transferring the written information, a bubble detector D for converting magnetic bubbles into electrical signals, a bubble generator G for generating magnetic bubbles and a replicate gate circuit R for replicating or transferring the information of the minor loops $\underline{m}$ to the read major line RML. further, T represents a transfer gate circuit for transferring the information on the write major line WML to the minor loops $\underline{m}$ or a swap gate for swapping the information of the minor loops $\underline{m}$ to the major line WML at the same time that the transfer of information proceeds, that is, for exchanging information between them. Further, a guardrail GR surrounding the outer periphery prevents entry of magnetic bubbles.

The gates R and A and the bubble generator G are controlled, depending on whether or not a current in a prescribed direction is supplied to conductors in a separate layer disposed in a particular relationship with the propagate pattern of permalloy. In the drawing, the conductor portion is represented by a thick solid line and the propagate pattern of the permalloy is represented by fine solid lines. The conductor layers respectively for the replicate gate, swap gate and bubble generator are connected on one ends thereof in common within the chip and, further, connected on the wiring circuits board outside the chip together with one of the common terminals for the main and dummy magnetic resistance elements of the bubble detector to common terminals COM 1 and COM 2.

Table 3 shows the constants of the 1M-bit block. The total number of minor loops is 584, and each minor loop stores 2,049 bits. In the 584 loops, there are 512 data loops (storage capacity per page: 64 bytes). Eleven loops are used for the error correction code. Sixty loops are redundant loops which are used when there are defective loops.

The storage capacity as viewed from the host CPU is 1,048,576 bits. There are 512 bits more that can be accessed by special commands.

TABLE 3

| Total number of bits | 1,196,616 bits |
|---|---|
| Number of available bits | 1,048,576 bits |
| Number of minor loops | 584 loops |
|  | 1 map loop |
|  | 512 data loops |
|  | 11 error correction loops |
|  | 60 redundant loops |
| Number of bits per loop | 2,049 bits |

The bubble memory allows defects in minor loops. The defective loops are memorized in the bubble memory. In the 4M-bit chip, a special loop called a map loop is provided to memorize the defect data for all minor loops. It also memorizes the address markers.

The WRITE line is used for data written into the bubble memory. During the operation, the data is generated upon each rotating megnetic field cycle. When writing 1, a pulse current is supplied to the generator to generate the bubble. When writing 0, no current is supplied. The generated data is propagated on the WRITE line until they are arranged at the minor loop swap gate.

A pulse current is supplied to the swap gate, and the new data on the WRITE line is exchanged with the old data on the minor loop at the swap gate position. The old data transferred to the WRITE line disappears at the guard rail after running out on the WRITE line.

Read operation occurs via the READ line. As the block replicator method is adopted, one-page data is replicated at a time. When a pulse current is supplied to the replicate gate (replicator), all minor loop data at the replicate gate position is divided into two groups. One group is kept in the minor loop and the other is output to the READ line. The data output to the READ line is propagated by the rotating magnetic field to the detector. The detector is formed by a parmalloy pattern and the resistance changes when the bubble approaches. Existance of the bubble can be detected as the voltage change caused by resistance change. When 3 mA is supplied to the detector, the output voltage is 5 to 10 mV.

[8] Writing of Write Protect Range Information

As described above, a usually available area of the MBM device per 1M-bit device is 64 words×8 bits (=$2^9$ minor loops)×2048 pages (=$2^{11}$ bits/minor loop)=$2^{20}$ bits (=1024 K bits=1M bits). Each minor loop has 2049 bits with one bit being redundant. When the usually available area is designated as pages 0 to 2047, a page 2048 is a hidden memory which is not used in a normal mode of operation.

In the present embodiment, the hidden memory in the page 2048 is used to store write protect address information.

Figure 2A:
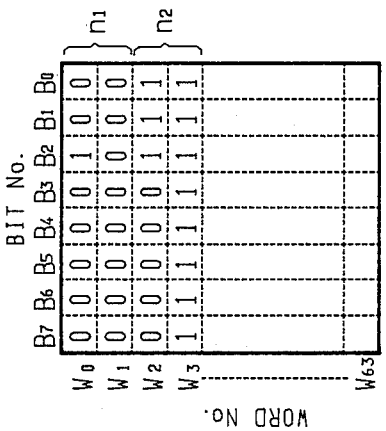

FIG. 2A illustrates the hidden memory area and the information stored therein.

Assuming that $n_1$ is the first page to be write-protected and $n_2$ is the last page, $n_1$ is stored in the first two bytes on the page 2048 and $n_2$ is stored in the two bytes following thereto, in hexadecimal codes. The storage content of FIG. 2A is represented by hexadecimal notation as $n_1$=0400 and $n_2$=67 FF. Thus, pages 1024 to 2047 of the MBM device are designated to the write protect range.

In a 4M-bit device having four 1M-bit blocks, a first block includes pages 0 to 2047, a second block includes pages 2048 to 4095, a third block includes pages 4096 to 6143 and a fourth block includes pages 6144 to 8191.

Figure 2B:
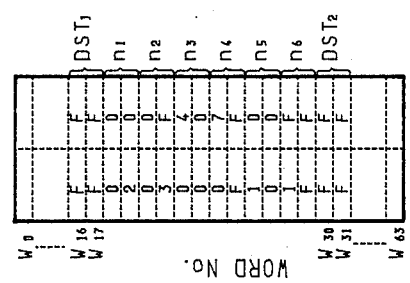
Figure 4:
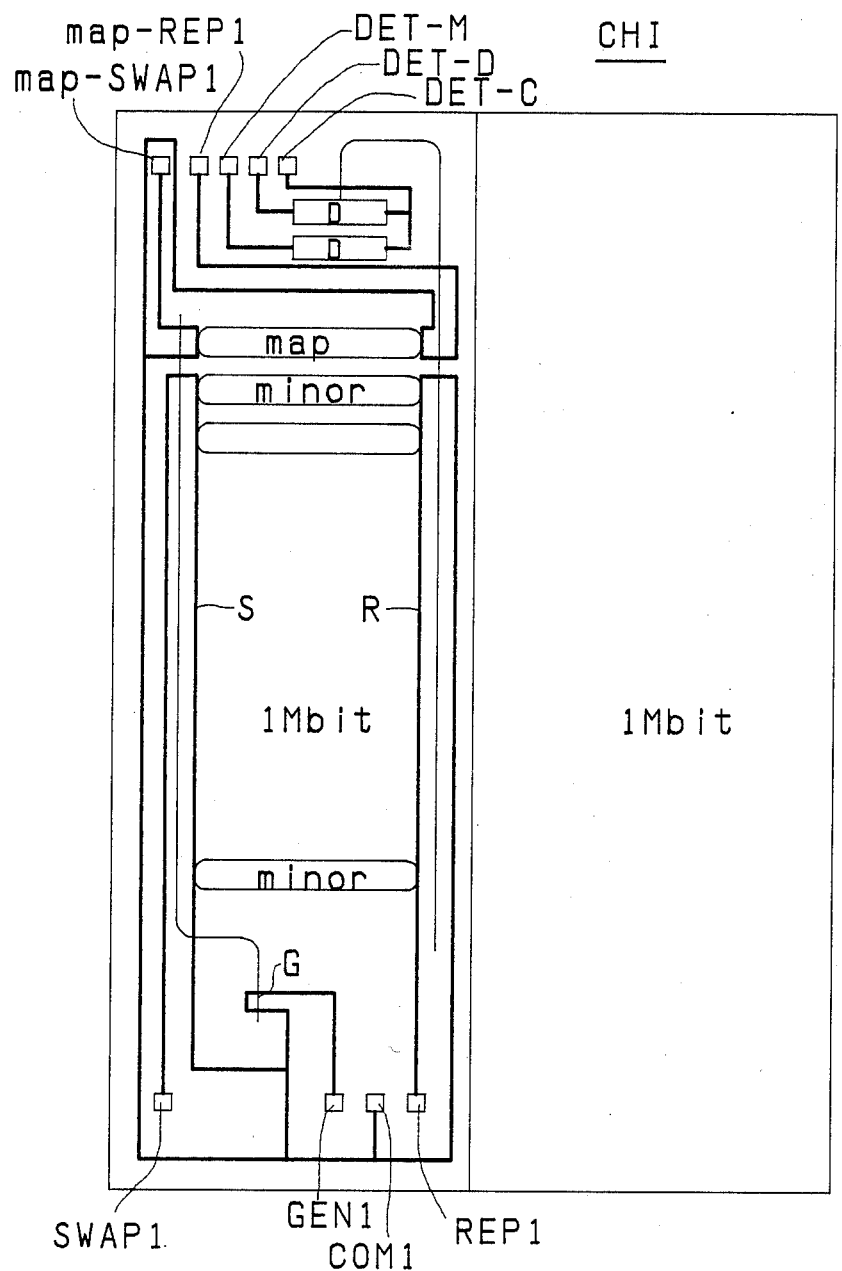
FIG. 4 is a functional diagram of a magnetic bubble memory chip.

FIG. 2B shows an example of the memory content written in the hidden memory when a plurality of designated areas of the 4M-bit MBM device are to be write-protected. $DST_1$ and $DST_2$ are codes for distinguishing the write protect information stored in the hidden memory from other information. The right protect information $n_1$–$n_6$ each is partitioned by a pair of codes of hexadecimal FFFF at the beginning and the end thereof. In the illustrated example, the designated write-protect pages are 64–127, 1024–2048 and 4096–8191.

A method for writing the write protect information into the hidden memory is now explained. The writing to the hidden memory is effected by sending a special command (B in hexadecimal code) WRITE BUBBLE (2) shown in Table 2 to the BMC from the host CPU.

This command is stored in a command register at address 1 (hexadecimal) of an interface register $RG_1$ in the BMC. The address of the hidden memory is stored from the host CPU in a page address register (PAR) (Table 1) at addresses 4 and 5 (hexadecimal) of the interface register $RG_1$ of the BMC.

[9] Write Protect Operation

The write protect operation is carried out in the following manner. Immediately after the power-on of the system, a power-on reset signal $\overline{POR}$ is applied to the MPU of the BMC, and the information stored in the hidden memory of the MBM device is written into the $RAM_1$ of the BMC through the sense amplifier SA, bubble I/O buffer $BF_6$ and I/O buffers $BF_5$ and $BF_3$.

Figure 3:
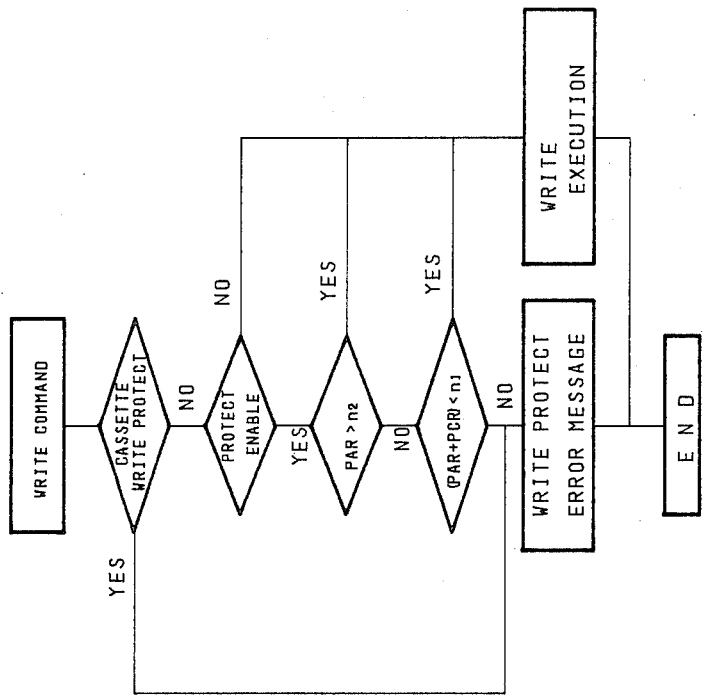
FIG. 3 is a flow-chart for explaining the operations of write protection and write excution.

FIG. 3 is a flow chart for illustrating the write protect operation.

When the WRITE ENABLE command shown in Table 2 is sent from the host CPU, the command is loaded to the command register CMR (Table 1) of the interface register as a hexadecimal "2" code. The MPU reads the command and checks if the MBM cassette CST bears a write protect mark or a switch therefor is in an active state. The write protect information of the cassette CST has been loaded to the interface register through the input buffer $BF_4$ of the BMC when the cassette CST was inserted into the system. If the cassette CST bears no write protect message, the process proceeds to the next step. If it bears the write protect message, the write protect error message is sent to the host CPU and the system is temporarily stopped. The write protect error message is stored by setting a specific bit of the error status register ESR2 (Table 1) of the interface register $RG_1$ to logical "1".

A write protect enable command can be stored at a specific bit of the device type register DTR of the interface register $RG_1$. If the protection is not required, the writing to the MBM device is executed irrespective of the content of the hidden memory of the MBM device.

The host CPU sends not only the write command but also the first page and the number of pages to be written to the page address register PAR (Table 1) and the page count register PCR, respectively, of the interface register, and the information is stored therein.

Assuming that the write protect range transferred to the $RAM_1$ of the BMC is from page $n_1$ to page $n_2$, it is checked if the first page to be written PAR exceeds the last page $n_2$ of the protect range. If $PAR > n_2$, the pages to be written are not within the protect range and the writing is executed. If PAR does not exceed $n_2$, it is checked if the first page $n_1$ of the protect range is larger than the last page (PAR+PCR) to be written. If (PAR+PCR)$<n_1$, the writing is executed, and if not, the write protect error message is executed and the writing is not executed.

If there are more than one protect range as shown in FIG. 2B, $n_3$ and $n_4$, and $n_5$ and $n_6$ are similarly compared with PAR and (PAR+PCR), respectively.

If $n_1=n_2=0$, that is, when the write protect information has not been written, and if the first page to be written from the host CPU is designated to page 0, the write protect is executed. In order to prevent it, a flag to invalidate the write protect enable may be set at the specific bit of the interface register $RG_1$ as described above.

Since the user of the system must designate the invalidation of the write protect enable by a program, a hardware may be designated such that the write protect is not executed if the use does not take any action. In one method, the register in which the protect enable information is stored is automatically reset when the system is stored immediately after the power-on of the system. In another method, information to assure that the write protect is not executed when the first page $n_1$ and the last page $n_2$ of the protect range stored in the $RAM_1$ are zero is stored in the interface register $RG_1$. Since the MBM device is usually shipped with all bubbles being temporarily erased (logical "0") (except for defect loop information of a map loop), the write protection is not executed if the user does not write any information to the hidden memory.

[10] Detailed Construction of the MBM Chip

Figure 5:
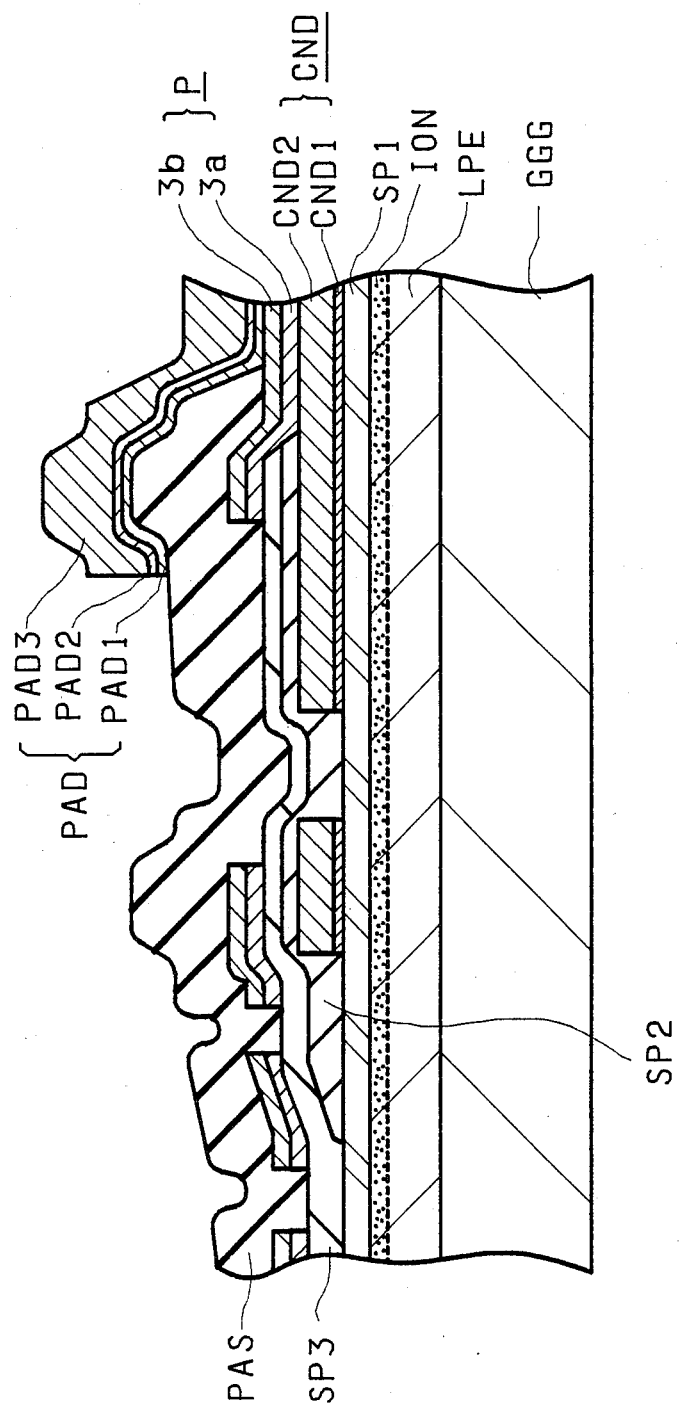
FIG. 5 is a cross-sectional view of a magnetic bubble memory chip.

FIG. 5 illustrates in cross section the neighborhood of a bonding pad PAD of a magnetic bubble memory chip.

GGG denotes a gadolinium-gallium-garnet substrate. LPE denotes a magnetic bubble film formed by the liquid-phase epitaxial growth method. A typical composition of the magnetic bubble film is shown i Table 2. ION denotes an ion-implanted layer formed on the surface of LPE film for the suppression of hard bubbles. SP1 denotes a first spacer which is formed of $SiO_2$ in a thickness of 3,000 A by the chemical-vapor deposition method, for example. CND1 and CND2 denote two conductor layers which function to control generation, replication, division), and swap of bubbles as described fully afterward. The upper conductor layer CND1 is made of Mo and the lower conductor CND2 is made of Au. SP2 and SP3 are interlayer insulating films (second and third spacers) made as of polyimide resin and adapted to insulate electrically the conductor CND from a transfer pattern layer P made as of permalloy and formed on the conductor CND. PAS denotes a passivation film formed as of $SiO_2$ by the gaseous-phase chemical reaction method. PAD denotes a bonding pad for the chip. Fine connector wires made as of Al are joined to this bonding pad by the thermocompression bonding method or the ultrasonic wave bonding method. The bonding pad PAD is formed as of Al.

P denotes a layer used in the path for bubble transfer, the parts for division, generation, interchange, and detection of bubles, and further in the guard rail part. Hereinafter, this layer will be referred to as "transfer pattern layer" for the sake of convenience of reference.

In the embodiment of FIG. 5, the transfer pattern layer P has a lower layer 3a formed of Fe-Ni alloy and an upper layer 3b of Fe-Si. Optionally, the materials for the two component layers may be interchanged as described above.

Figure 6:
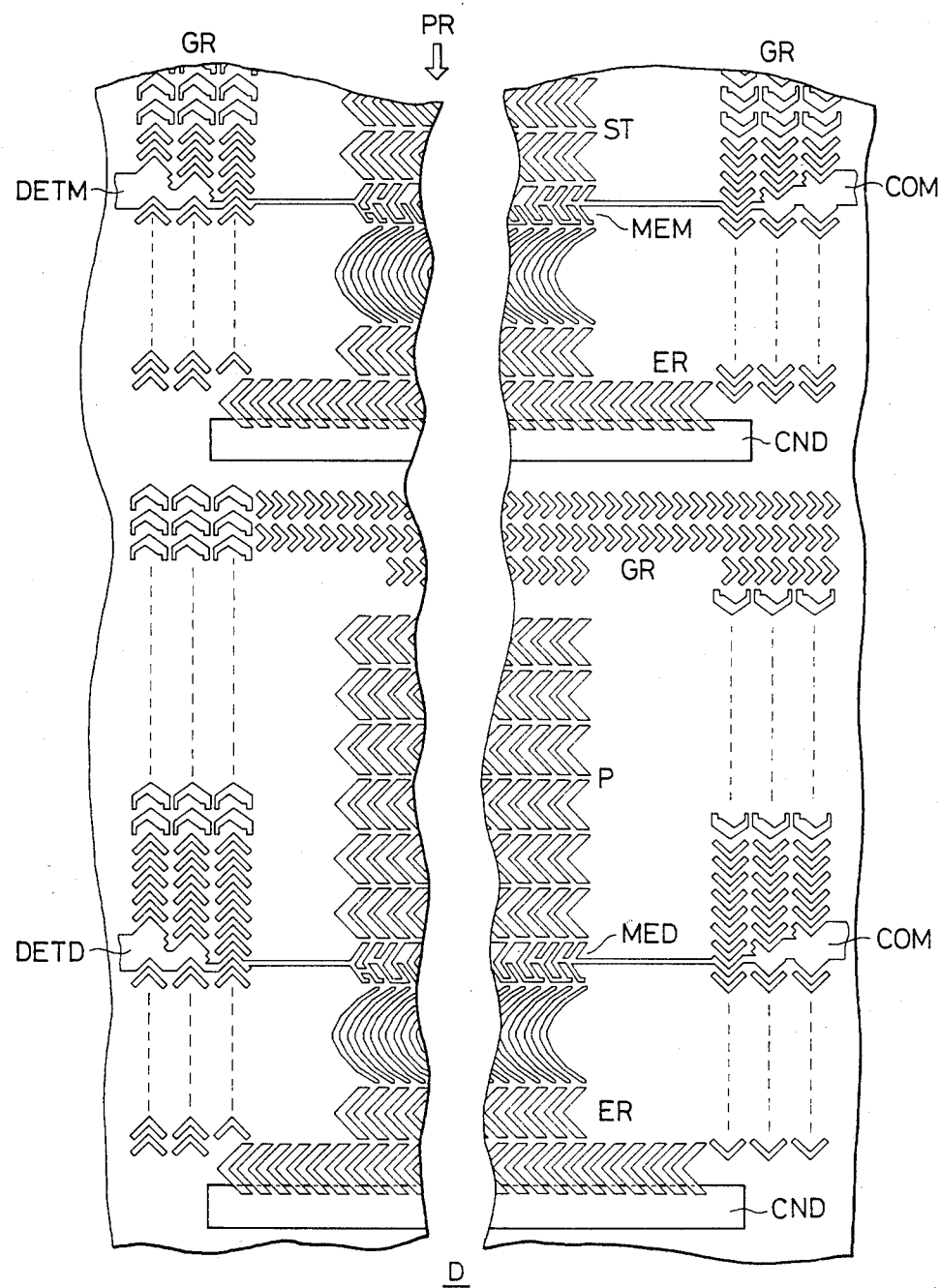
FIG. 6, FIG. 7, FIG. 8 and FIG. 9 are diagrams respectively illustrating a bubble detector, a guard rail, a bubble generator, a swap gate, and a replicate gate according to the present invention.

FIG. 6 represents a bubble detector D. In the diagram, MEM denotes a main magnetic resistance element. It effects the detection of presence or absence of a bubble by virtue of the phenomenon that the magnitude of its resistance is varied when a bubble (stretched laterally in the shape of a strip) passes the detector. MED denotes a dummy magnetic resistance element similar in pattern to MEM. It is used for the purpose of detecting a noise component generated as by the influence of the rotating magnetic field. On the element MEM, bubble stretching serving to transfer bubbles downwardly while stretching them in the lateral direction are formed in some tens of steps, although they are depicted in only two steps in the diagram. PR denotes the direction of transfer of the bubbles. ER denotes an eraser for bubbles. This easer ER effects erasure of bubbles when they reach the conductor layer CND.

Around the detector D and between the dummy and main detectors, there is disposed a guard rail GR which consists of three rows of patterns. It serves to expel out of the guard rail GR unnecessary bubbles generated inside the guard rail or prevent entry into the guard rail GR of unnecessary bubbles generated outside the guard rail GR.

FIG. 7 illustrates a bubble generator.

Bubbles are controllably generated at the hairpin shaped portion of the conductor CND and the pattern Pgen by directing driving current to the conductor CND and the generated bubbles are serially propagated along the propagating pattern $P_1$ to $P_7$.

Figure 8:
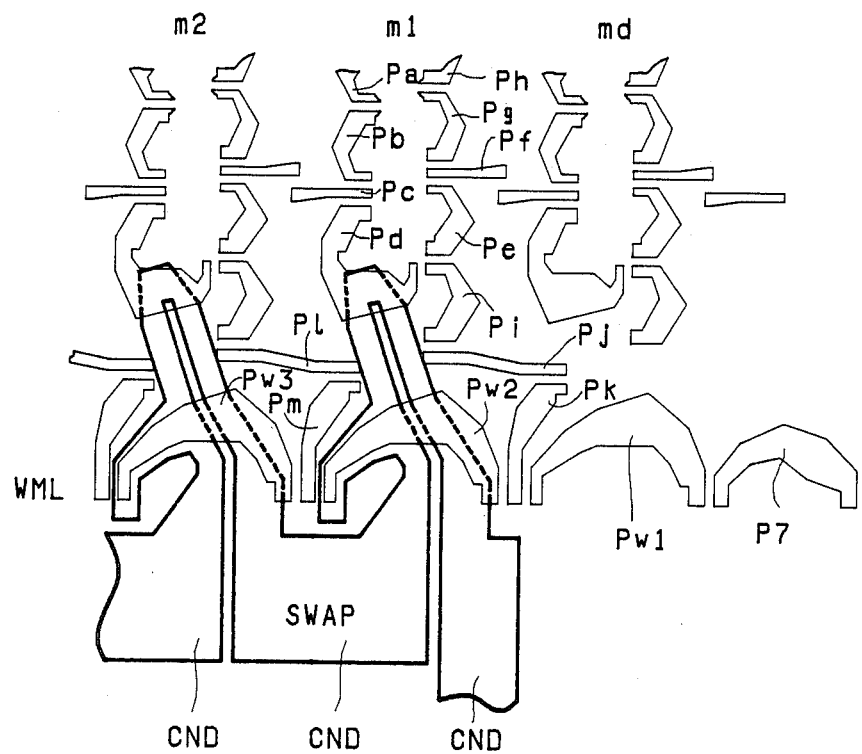

FIG. 8 depicts a minor loop m formed of transfer patterns Pa-Ph, a major line WML formed of a row of transfer patterns $P_{w1}$-$P_{w3}$, and a swap gate part SWAP formed of hairpin conductor layers CND. $P_7$ equals the transfer pattern $P_7$ of the bubble generator shown in FIG. 10. In other words, the bubbles generated by the bubble generator GEN are transferred through the transfer paths of $P_1$-$P_7$ to the write in major line WML. when electric current is passed to the swap conductor CND, the bubbles from the transfer pattern Pd of the minor loop m are transferred through the transfer patterns Pe and Pm to the transfer pattern $P_{w3}$ of the major line WML and the bubbles from the transfer pattern $P_{w1}$ of the major line are transferred through the transfer patterns Pk, Pj, and Pi to the transfer pattern Pe of the minor loop to effect interchange of bubbles, i.e. writing of data. The minor loop ma on the righthand end is not provided with any swap gate, because it is a dummy loop which has no use for those bubbles injected for alleviating the peripheral effect.

The interchange of bubbles can be carried out with electric current of a small magnitude by forming the transfer patterns Pi-Pm at the positions of interchange each in a multi-layer structure.

FIG. 9 illustrates bubble replicator or divider.

With reference to FIG. 9, the bubbles are normally transferred through the patterns Pn-Pq and Ps-Px in the order mentioned. When electric current is passed to the conductor CND, the bubbles are divided at the position of the transfer pattern Pq and one of the divided bubbles is transferred through the patterns Py, P8-P10, to the read major line RML.

We claim:

1. An information handling system comprising a magnetic bubble memory device with a plurality of redundant storage areas usable for defective storage areas thereof, a bubble memory controller, a host central processing unit and means for inhibiting accessing of said defective storage areas to protect information from being read out therefrom and/or writing therein, said controller having a write protection function in which an information read out from a certain address region of said device and address information representative of an address region for said device in which new information is to be written are compared, and a writing operation for the storage areas other than said defective storage areas of said device is inhibited according to the comparison result.

2. A magnetic bubble memory system comprising a bubble memory device and a bubble memory controller, said device including a plurality of storage loops each comprised of a plurality of storage bit locations, each of a corresponding bit location among said storage loops constituting a page address, said controller reading information from a certain page address of said device irrespective of the condition whether magnetic bubble domains exist in said certain page address in an initializing mode of said system, said controller enabling inhibition of the write operation for said device when said information read is information representative of an address range in which no new data must be written.

* * * * *